(12) United States Patent
Kim et al.

(10) Patent No.: US 10,607,934 B2
(45) Date of Patent: Mar. 31, 2020

(54) FUSE OF SEMICONDUCTOR DEVICE AND METHOD FOR FORMING THE SAME

(71) Applicants: SK hynix Inc., Gyeonggi-do (KR); INDUSTRY-ACADEMIA COOPERATION GROUP OF SEJONG UNIVERSITY, Seoul (KR)

(72) Inventors: Deok-Kee Kim, Seoul (KR); Jae Hong Kim, Gyeonggi-do (KR); Seo Woo Nam, Gyeonggi-do (KR)

(73) Assignees: SK hynix Inc., Gyeonggi-do (KR); INDUSTRY-ACAMEDIA COOPERATION GROUP OF SEJONG UNIVERSITY, Seoul (KR)

( * ) Notice: Subject to any disclaimer, the term of this patent is extended or adjusted under 35 U.S.C. 154(b) by 0 days.

(21) Appl. No.: 15/788,922

(22) Filed: Oct. 20, 2017

(65) Prior Publication Data
US 2018/0301411 A1     Oct. 18, 2018

(30) Foreign Application Priority Data
Apr. 13, 2017  (KR) .......................... 10-2017-0048017

(51) Int. Cl.
*H01L 23/525*          (2006.01)

(52) U.S. Cl.
CPC ................. *H01L 23/5256* (2013.01); *H01L 2223/54433* (2013.01)

(58) Field of Classification Search
CPC ... H01L 23/5256; H01L 23/585; H01L 23/60; H01L 23/525; H01L 23/58
See application file for complete search history.

(56) References Cited

U.S. PATENT DOCUMENTS

| | | | |
|---|---|---|---|
| 2015/0102458 A1* | 4/2015 | Choi | H01L 23/5256 257/529 |
| 2016/0163643 A1* | 6/2016 | Choi | H01L 23/5256 257/529 |

FOREIGN PATENT DOCUMENTS

| | | |
|---|---|---|
| KR | 101561650 | 10/2015 |
| KR | 101631452 | 6/2016 |
| KR | 1020160068212 | 6/2016 |

* cited by examiner

*Primary Examiner* — Joseph M Galvin, III
(74) *Attorney, Agent, or Firm* — IP & T Group LLP

(57) ABSTRACT

A fuse of a semiconductor device may include: a fuse link suitable for extending in a first direction and connecting first and second electrodes; a dummy strip suitable for extending in the first direction, and with a predetermined distance from the fuse link in a second direction perpendicular to the first direction; and an air channel formed between the fuse link and the dummy strip to contact with the fuse link.

3 Claims, 6 Drawing Sheets

FUSE OF SEMICONDUCTOR DEVICE AND METHOD FOR FORMING THE SAME

CROSS-REFERENCE TO RELATED APPLICATION

The present application claims priority of Korean Patent Application No. 10-2017-0048017, filed on Apr. 13, 2017, which is herein incorporated by reference in its entirety.

BACKGROUND

1. Field

Various embodiments relate to a semiconductor device, and more particularly, to a fuse of a semiconductor device and a method for forming the same.

2. Description of the Related Art

In general, a fuse of a semiconductor device may be used for implementing redundancy, tuning a circuit, storing information, or changing an electrical chip identification (ID) and structure, in order to raise the chip yield in a semiconductor device such as a Complementary Metal Oxide Semiconductor (CMOS) chip.

For example, a semiconductor memory device may use a fuse circuit to implement memory redundancy. A memory device such as DRAM includes a large number of cells, but may be determined to be a defective product even though a defect occurs in any one of the cells. When the memory device is discarded as a defective product even through a defect occurred only in a small number of cells, it is inefficient in terms of the yield. Therefore, the defective cells can be replaced with redundancy memory cells installed in the memory device through a fuse, in order to increase the yield. Furthermore, the fuse technology may be applied to not only a memory, but also a semiconductor logic circuit for tuning a circuit or changing an electrical chip ID and structure.

One of requirements for the fuse technology is to reduce a fuse area, and a selection element which occupies most of the fuse area. Therefore, there is a demand for a technique capable of lowering a program current applied to the selection element in order to reduce an area of a program transistor for providing the program current in the fuse.

SUMMARY

Various embodiments are directed to a fuse of a semiconductor device, which can be blown at a low program current, and a method for forming the same.

In an embodiment, a fuse of a semiconductor device may include: a fuse link suitable for extending in a first direction and connecting first and second electrodes; a dummy strip suitable for extending in the first direction, and with a predetermined distance from the fuse link in a second direction perpendicular to the first direction; and an air channel formed between the fuse link and the dummy strip to contact with the fuse link.

In an embodiment, a fuse link suitable for extending in a first direction and connecting first and second electrodes; a dummy strip suitable for extending in the first direction, and with a predetermined distance from the fuse link in a second direction perpendicular to the first direction; and a plurality of air holes having a periodic pattern and formed between the fuse link and the dummy strip in a vertical direction of the fuse link.

In an embodiment, a method for forming a fuse of a semiconductor device may include: forming a fuse link and a dummy strip extending in a first direction in a first insulating layer, the dummy strip being adjacent to the fuse link in a second direction perpendicular to the first direction; forming an air channel between the fuse link and the dummy strip, the air channel being in contact with the fuse link; and forming a second insulating layer over the fuse link, the dummy strip and the air channel without filling the air channel.

In an embodiment, a method for forming a fuse of a semiconductor device may include: forming a fuse link and a dummy strip extending in a first direction in a first insulating layer, the dummy strip being adjacent to the fuse link in a second direction perpendicular to the first direction; forming a plurality of air holes having a periodic pattern between the fuse link and the dummy strip in a vertical direction of the fuse link; and forming a second insulating layer over the fuse link, the dummy strip and the air holes, without filling the air holes.

According to the present embodiments, fuse blowing can be performed at a lower program current, and the area of the program transistor can be significantly reduced, which makes it possible to reduce the area per fuse bit while improving the reliability.

DETAILED DESCRIPTION

Various embodiments will be described below in detail with reference to the accompanying drawings, so that this disclosure will be thorough and complete, and will fully convey the scope of the present disclosure to those skilled in the art. Throughout the disclosure, like reference numerals refer to like parts throughout the various figures and embodiments of the present disclosure.

Moreover, detailed descriptions related to well-known functions or configurations will be omitted in order not to unnecessarily obscure the subject matter of the present disclosure.

Terms, such as first and second, may be used to describe various components, but the components are not limited by the terms, and the terms are used to distinguish one component from another component.

Figure 1:
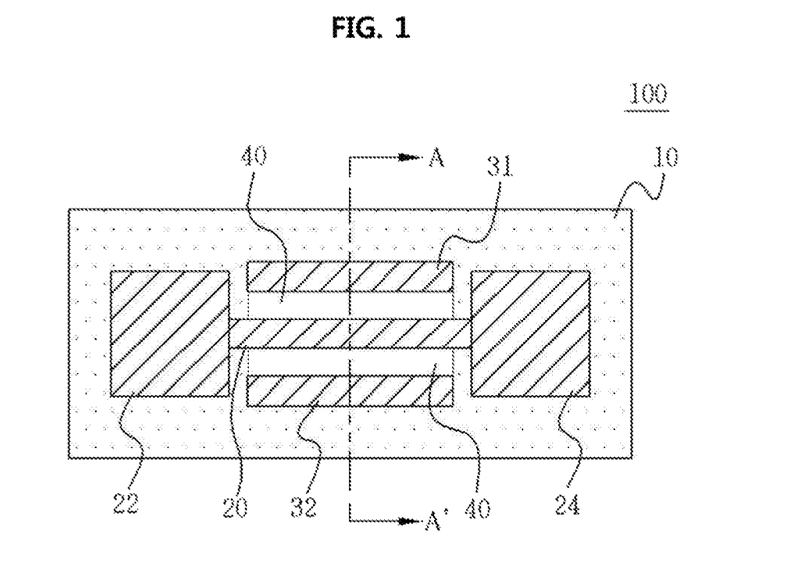
FIG. 1 is a plane view illustrating a fuse of a semiconductor device according to an embodiment of the present invention.

FIG. 1 is a plane view illustrating a fuse 100 of a semiconductor device according to an embodiment of the present invention.

Referring to FIG. 1, the fuse 100 of the semiconductor device may include first and second electrodes 22 and 24, a fuse link 20, a dummy strip 30 and an air channel 40, which are formed in an insulating layer 10.

The fuse link 20 may extend in a first direction between the first and second electrodes 22 and 24 and may be formed of an electrically programmable material, so as to electrically connect the first and second electrodes 22 and 24. The fuse link 20 may be formed of a metallic material such as copper. The first electrode 22 may be referred to as a cathode, and the second electrode 24 may be referred to as an anode. The first electrode 22 may receive a negative voltage or ground voltage through a program transistor (not illustrated), and the second electrode 24 may receive a positive voltage through the program transistor. The fuse link 20 may be integrated with the first and second electrodes 22 and 24, and may be formed of the same material as the first and second electrodes 22 and 24. Fuse programming may include a process of passing a program current through the fuse link 20 by applying a voltage to the first and second electrodes 22 and 24.

When a fusing signal is applied to the gate of the program transistor, a program current flows through the fuse link 20 due to a potential difference between the first and second electrodes 22 and 24. The program current causes electro-migration and thermos-migration in the fuse link 20. Through this process, the fuse link 20 may be blown.

When a negative voltage is applied to the first electrode 22 and a positive voltage is applied to the second electrode 24, a flow of electrons from the first electrode 22 serving as the cathode to the second electrode 24 serving as the anode may occur in the fuse link 20. When electrons migrate in the fuse link 20, the electrons may collide with atoms constituting the fuse link 20, thereby causing electro-migration to migrate the atoms.

The drivability caused by the electro-migration in the fuse link 20 may be varied by changing the cross-sectional area of the fuse link 20. FIG. 1 illustrates that the fuse link 20 extends in the first direction between the first and second electrodes 22 and 24 and has a line shape while having the same cross-sectional area. The structure is only an example for convenience of description, and is not limited thereto. The fuse link 20 may include bended portions corresponding to the positions of the first and second electrodes 22 and 24 and having different cross-sectional areas.

When a program current flows through the fuse link 20, Joule's heat may be generated in the fuse link 20. The Joule's heat generated by the program current may have a non-uniform temperature distribution in the fuse link 20. The non-uniform temperature distribution in the fuse link 20 may exhibit the highest temperature at the central portion of the fuse link 20.

The non-uniform temperature distribution may cause thermos-migration of atoms in the fuse link 20. The thermos-migration may include thermos-migration in which atoms migrate toward the anode from the central portion of the fuse link 20 and thermos-migration in which atoms migrate toward the cathode from the central portion of the fuse link 20. The electronic drivability and thermal drivability respectively caused by the electro-migration and thermos-migration in the fuse link 20 may be added to blow the fuse link 20.

The dummy strip 30 may be disposed adjacent to the fuse link 20, and formed in parallel to the first direction in which the fuse link 20 extends. The dummy strip 30 may extend in the first direction, and with a predetermined distance from the fuse link 20 in a second direction perpendicular to the first direction. In an embodiment, the dummy strip 30 may extend in a direction which has a minute angle to the first direction, which differs from a perfect parallel. The dummy strip 30 may include a first dummy strip 31 and a second dummy strip 32, which are formed at both sides of the fuse link 20 and with a predetermined distance from the fuse link 20 in the second direction, and extend in the first direction.

The dummy strip 30 may be formed of the same material as the first and second electrodes 22 and 24 and the fuse link 20. For example, the dummy strip 30 may be formed of a metallic material such as copper.

The air channel 40 may be formed between the fuse link 20 and the dummy strip 30. The air channel 40 may be formed in contact with a side surface of the fuse link 20. The air channel 40 may be formed to contact both sides of the fuse link 20 and one side of the dummy strip 30. The air channel 40 may have a lower dielectric constant than the insulating layer 10. The insulating layer 10 may be formed of a low-k dielectric. The low-k dielectric may include a material having a lower dielectric constant than silicon oxide ($SiO_2$) used as a semiconductor interlayer dielectric material.

The air channel 40 may serve as a thermal insulator and crack stopper during fuse program. Since the fuse link 20 is insulated from Joule's heat by the air channel 40 during fuse program, the thermal drivability caused by thermos-migration and the electronic drivability caused by electro-migration can be improved. Therefore, the air channel 40 can allow the fuse to be blown at a lower program current, and prevent a damage of the surrounding structure during fuse blowing. As a result, since the area of the program transistor is significantly reduced, the area per fuse bit can be reduced while the reliability is improved.

The insulating layer 10 may cover the first and second electrodes 22 and 24, the fuse link 20, the dummy strip 30 and the air channel 40. The insulating layer 10 may be formed of a low-k dielectric having a lower dielectric constant than silicon oxide ($SiO_2$) which is used as a semiconductor interlayer dielectric material.

Figure 2:
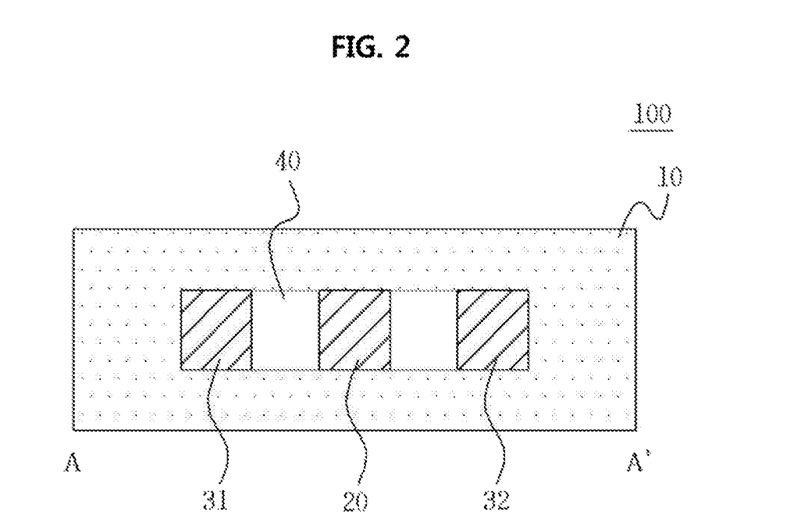
FIG. 2 is a cross-sectional view taken along the line A-A' of FIG. 1.

FIG. 2 is a cross-sectional view taken along the line A-A' of FIG. 1.

Referring to FIG. 2, the air channel 40 may be formed at the same level or height as the fuse link 20 in a vertical direction of the fuse link 20. Here, the vertical direction may be orthogonal to both of the first and second directions. The air channel 40 may be formed at the same level or height as the fuse link 20 and the dummy strip 30 in the vertical direction of the fuse link 20. In an embodiment, the air channel 40 may be formed at a level or height with a minute level difference from the fuse link 20 and the dummy strip 30. The level or height may be defined as a position formed in the vertical direction of the fuse link 20. The air channel 40 may be formed between the fuse link 20 and the dummy strip 30 so as to be in contact with both sides of the fuse link 20 and one side of the dummy strip 30. The air channel 40 may be formed between the fuse link 20 and each of the first and second dummy strips 31 and 32 to be in contact with both sides of the fuse link 20 and one side of each of the first and second dummy strips 31 and 32. For example, the air channel 40 may be formed between a first side of the first dummy strip 31 and a first side of the fuse link 20, and between a second side of the fuse link 20 and a first side of the second dummy strip 32.

FIG. 2 illustrates that the air channel 40, the fuse link 20 and the dummy strip 30 are formed at the same level or height, but the present embodiment is not limited thereto. The air channel 40 may be formed to contact both sides of the fuse link 20 and one side of the dummy strip 30, and expanded to a higher level, a lower level or higher and lower levels of the fuse link 20 in the vertical direction of the fuse link 20.

Since the air channel 40 insulates the fuse link 20 from Joule's heat generated therein during fuse program, the air channel 40 can improve the thermal drivability caused by thermos-migration and the electronic drivability caused by electro-migration. The air channel 40 may prevent a damage of the surrounding structures during fuse program. According to the present embodiment, fuse blowing can be performed at a low program current, and the fuse link 20 can be stably blown. Therefore, the area of the program transistor can be significantly reduced, which makes it possible to decrease the area per fuse bit while improving the reliability.

Figure 3:
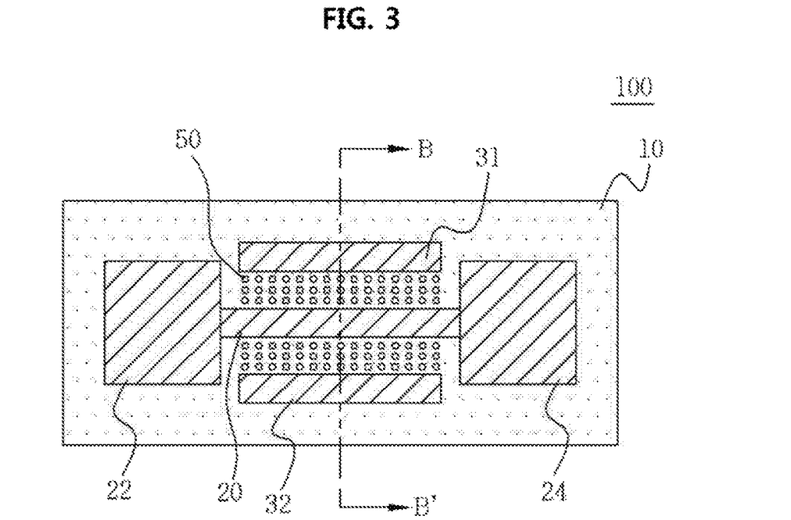
FIG. 3 is a plane view illustrating a fuse of a semiconductor device according to another embodiment of the present invention.
Figure 4:
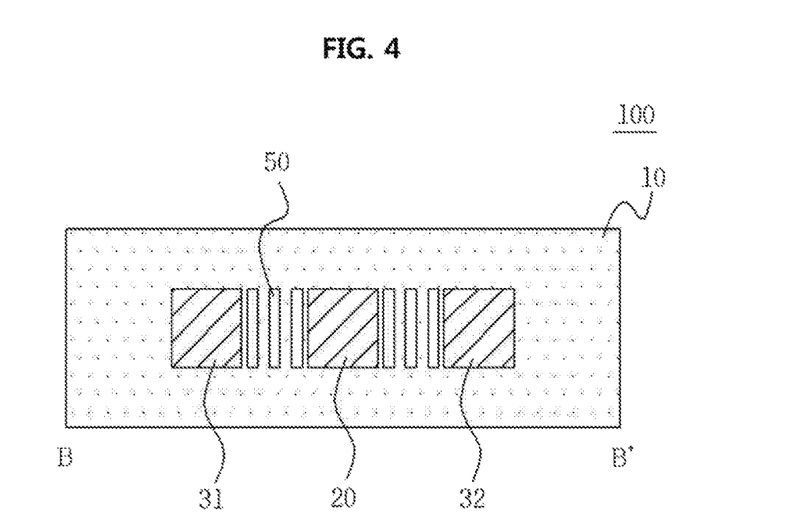
FIG. 4 is a cross-sectional view taken along the line B-B' of FIG. 3.

FIG. 3 is a plane view illustrating a fuse 100 according to another embodiment of the present invention. In FIGS. 3 and 4, like reference numerals are used to refer to the same elements.

Referring to FIG. 3, the fuse 100 may include first and second electrodes 22 and 24, a fuse link 20, a dummy strip 30 and air holes 50, which are formed in an insulating layer 10.

The fuse link 20 may extend in a first direction between the first and second electrodes 22 and 24 and may be formed of an electrically programmable material, so as to electrically connect the first and second electrodes 22 and 24. The fuse link 20 may be formed of a metallic material such as copper. The first and second electrodes 22 and 24 and the fuse link 20 may be integrated with each other, and formed of the same material.

During fuse program, a program current flows through the fuse link 20, and causes electro-migration and thermos-migration in the fuse link 20. Through this process, the fuse link 20 may be blown.

The dummy strip 30 may be disposed adjacent to the fuse link 20, and be formed in parallel to the first direction in which the fuse link 20 extends. The dummy strip 30 may extend in the first direction, and with a predetermined distance from the fuse link 20 in a second direction perpendicular to the first direction. The dummy strip 30 may include a first dummy strip 31 and a second dummy strip 32, which are formed at both sides of the fuse link 20 and with a predetermined distance from the fuse link 20 in the second direction, and extend in the first direction. The dummy strip 30 may be formed of the same material as the first and second electrodes 22 and 24 and the fuse link 20. For example, the dummy strip 30 may be formed of a metallic material such as copper.

The air holes 50 may be formed between the fuse link 20 and the dummy strip 30. The air holes 50 may be formed in a vertical direction of the fuse link 20 between the fuse link 20 and the dummy strip 30 in the insulating layer 10. The air holes 50 may be arranged between the fuse link 20 and the dummy strip 30, while having a periodic pattern. Each of the air holes 50 may be formed with a nano-sized hole. The air holes 50 may have a lower dielectric constant than the insulating layer 10. The insulating layer 10 may be formed of a low-k dielectric. The low-k dielectric may include a material having a lower dielectric constant than silicon oxide ($SiO_2$) which is used as a semiconductor interlayer dielectric material.

The air holes 50 may serve as a thermal insulator and crack stopper during fuse program. Since the fuse link 20 is insulated from Joule's heat generated therein by the air holes 50 during fuse program, the thermal drivability caused by thermos-migration and the electronic drivability caused by electro-migration can be improved. Therefore, the air holes 50 may allow the fuse to be blown at a lower program current. Also, the air holes 50 may prevent a damage of the surrounding structures during fuse blowing. According to the present embodiment, the area of the program transistor can be significantly reduced to decrease the area per fuse bit, and the fuse link 20 can be stably blown.

FIG. 4 is a cross-sectional view taken along the line B-B' of FIG. 3.

Referring to FIG. 4, the air holes 50 may be formed at the same level or height as the fuse link 20 in a vertical direction of the fuse link 20. The air holes 50 may be formed at the same level or height as the fuse link 20 and the dummy strip 30 in the vertical direction of the fuse link 20. In an embodiment, the air holes 50 may be formed at a level or height with a minute level difference from the fuse link 20 and the dummy strip 30. The level or height may be defined as a position formed in the vertical direction of the fuse link 20. The air holes 50 may be formed in the vertical direction of the fuse link 20 between the fuse link 20 and the dummy strip 30 in the insulating layer 10. The air holes 50 may be arranged between the fuse link 20 and the dummy strip 30, while having a periodic pattern. The air holes 50 may be arranged between the fuse link 20 and each of the first and second dummy strips 31 and 32 while having a periodic pattern, and may be formed in the vertical direction of the fuse link 20. For example, the air holes 50 may be arranged between the first dummy strip 31 and the fuse link 20, and between the fuse link 20 and the second dummy strip 32.

FIG. 4 illustrates that the air holes 50, the fuse link 20 and the dummy strip 30 are formed at the same level or height in the vertical direction of the fuse link 20, but the present embodiment is not limited thereto. The air holes 50 may be expanded to a higher level, a lower level or higher and lower levels in the vertical direction of the fuse link 20.

Since the air holes 50 insulate the fuse link 20 from the Joule's heat generated therein during fuse program, the air holes 50 can improve the thermal drivability caused by thermos-migration and the electronic drivability caused by electro-migration. Furthermore, the air holes 50 may prevent a damage of the surrounding structures during fuse program. According to the present embodiment, fuse blowing can be performed at a low program current, and the fuse link 20 can be stably blown. Therefore, the area of the program transistor can be significantly reduced, which makes it possible to decrease the area per fuse bit while improving the reliability.

FIGS. 5A to 5D are cross-sectional views illustrating a method for forming a fuse according to an embodiment of the present invention. FIGS. 5A to 5D show the cross-sectional views taken along the line A-A' of FIG. 1.

Figure 5A:
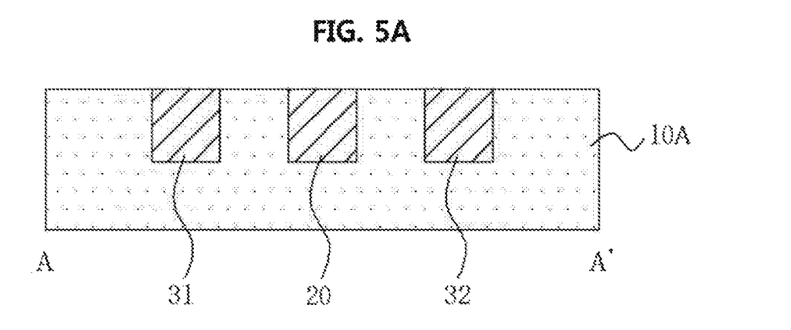
FIGS. 5A to 5D are cross-sectional views illustrating a method for forming a fuse of a semiconductor device in accordance with an embodiment of the present invention.

Referring to FIG. 5A, a fuse link 20 and a dummy strip 30 may be formed in a first insulating layer 10A. The first insulating layer 10A may be formed over a semiconductor substrate (not shown). The first insulating layer 10A may include a low-k dielectric. The low-k dielectric may include a material having a lower dielectric constant than silicon oxide ($SiO_2$) which is used as a semiconductor interlayer dielectric material.

The first insulating layer 10A may have a thickness enough to form the fuse link 20 and the dummy strip 30. The first insulating layer 10A may be partially etched to form the fuse link 20 and the dummy strip 30.

The fuse link 20 may extend between the first and second electrodes 22 and 24 (refer to FIG. 1) so as to electrically connect the first and second electrodes 22 and 24, and the dummy strip 30 may be formed in parallel to a first direction in which the fuse link 20 extends, and with a predetermined distance from the fuse link 20 in a second direction perpendicular to the first direction. The fuse link 20 and the dummy strip 30 may be formed of a metallic material such as copper. The fuse link 20 may be integrated with the first and second electrodes 22 and 24, and formed of the same material as the first and second electrodes 22 and 24.

Figure 5B:
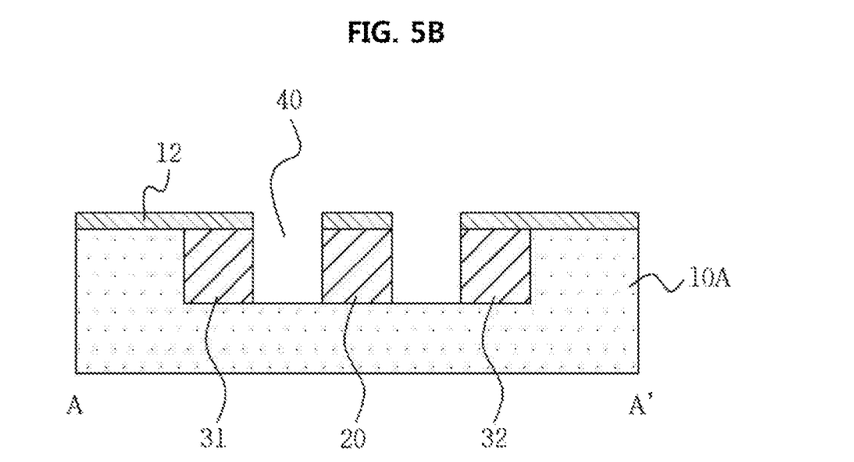

Referring to FIG. 5B, an air channel 40 may be formed. The air channel 40 may be formed through a process of etching a part of the first insulating layer 10A between the fuse link 20 and the dummy strip 30 such that the air channel 40 is in contact with both sides of the fuse link 20 and one side of the dummy strip 30.

The air channel 40 may be formed by the following process.

First, the position of the air channel 40 which is to be formed in the first insulating layer 10A may be defined through a photo-resist coating process, an exposure process and a develop process. For this operation, the top surfaces of the fuse link 20 and the dummy strip 30 and the top surface of the first insulating layer 10A may be coated with photo resist 12. The photo resist 12 may include photosensitive resin which is applied to the first insulating layer 10A in order to form the air channel 40 in a lithography process which is one of several semiconductor processes.

A part of the first insulating layer 10A may be etched. At this time, the part of the first insulating layer 10A may correspond to the position defined by the photo resist 12. Then, the part of the first insulating layer 10A may be etched to form the air channel 40 at the same level or height as the fuse link 20 in a vertical direction of the fuse link 20. FIG. 5B illustrates that the air channel 40, the fuse link 20 and the dummy strip 30 are formed at the same level or height, but the present embodiment is not limited thereto. The air channel 40 may be expanded to a higher level, a lower level or higher and lower levels in a vertical direction of the fuse link 20.

Figure 5C:
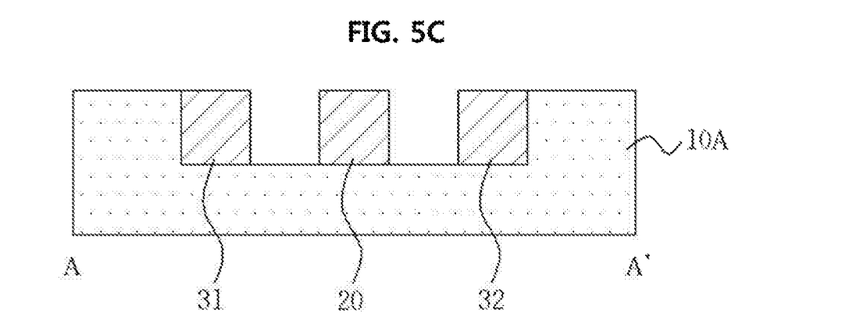

Referring to FIG. 5C, the photo resist 12 may be removed after the etching.

Figure 5D:
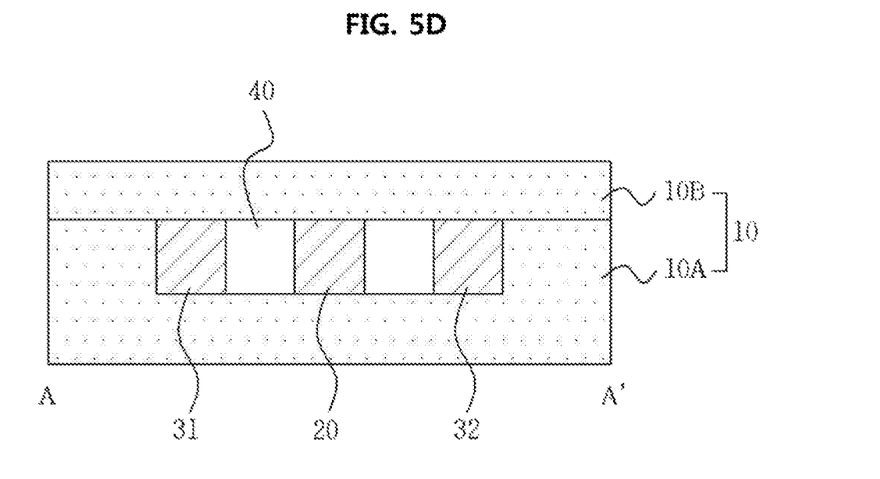

Referring to FIG. 5D, a second insulating layer 10B may be formed over the fuse link 20, the dummy strip 30 and the air channel 40 without filling the air channel 40. For example, as the second insulating layer 10B is deposited through CVD (Chemical Vapor Deposition) which allows a pinch-off, the air channel 40 may be sealed. The second insulating layer 10B may be formed of a material substantially the same as the first insulating layer 10A, and the first and second insulating layers 10A and 10B may correspond to the insulating layer 10 of FIGS. 1 and 2. The air channel 40 formed to contact both sides of the fuse link 20, and one side of the dummy strip 30 can insulate the fuse link 20 from the Joule's heat generated therein during fuse program, thus, preventing damage to the surrounding structures.

FIGS. 6A to 6H are cross-sectional views illustrating a method for forming a fuse according to another embodiment of the present invention. FIGS. 6A to 6H show the cross-sectional views taken along the line B-B' of FIG. 3.

Figure 6A:
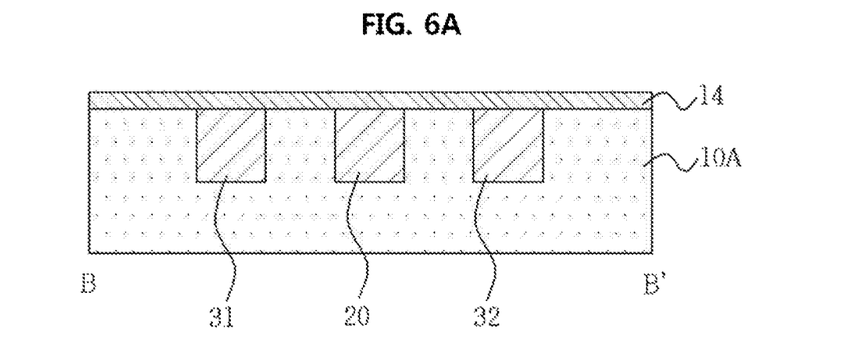
FIGS. 6A to 6H are cross-sectional views illustrating a method for forming a fuse of a semiconductor device in accordance with an embodiment of the present invention.

First, referring to FIG. 6A, a fuse link 20 and a dummy strip 30 may be formed in a first insulating layer 10A. The first insulating layer 10A may include a low-k dielectric having a lower dielectric constant than silicon oxide ($SiO_2$) which is used as a semiconductor interlayer dielectric material. The first insulating layer 10A may have a thickness large enough to form the fuse link 20 and the dummy strip 30 therein, and the first insulating layer 10A may be partially etched to form the fuse link 20 and the dummy strip 30.

The fuse link 20 may extend between the first and second electrodes 22 and 24 (refer to FIG. 3) so as to electrically connect the first and second electrodes 22 and 24, and the dummy strip 30 may be formed in parallel to a first direction in which the fuse link 20 extends, and with a predetermined distance from the fuse link 20 in a second direction perpendicular to the first direction. The fuse link 20 and the dummy strip 30 may be formed of a metallic material such as copper. The fuse link 20 may be integrated with the first and second electrodes 22 and 24, and formed of the same material as the first and second electrodes 22 and 24.

In order to form air holes 50, a hard mask 14 may be formed over the fuse link 20, the dummy strip 30 and the insulating layer.

Figure 6B:
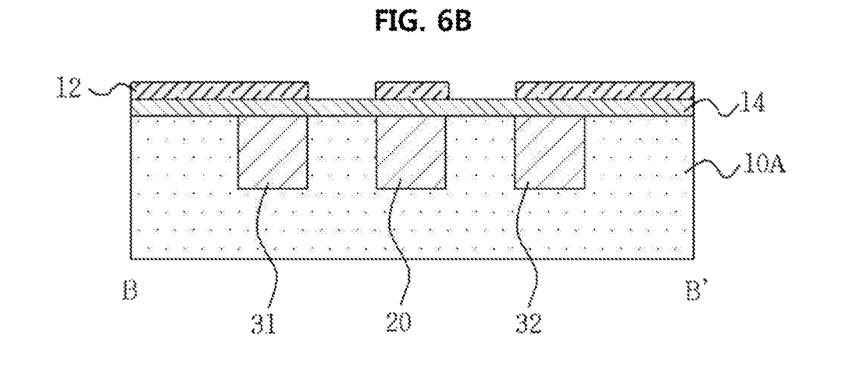

Then, referring to FIG. 6B, the top surface of the hard mask 14 may be coated with photo resist 12 in order to define target positions where the air holes 50 are to be formed in the first insulating layer 10A. The portion between the dummy strip 30 and the fuse link 20, where the air holes 50 are to be formed, may be exposed through an exposure and develop process. The photo resist 12 may include photosensitive resin applied to the surface of the hard mask 14 in order to form the air holes 50 during a lithography process which is one of several semiconductor processes.

Figure 6C:
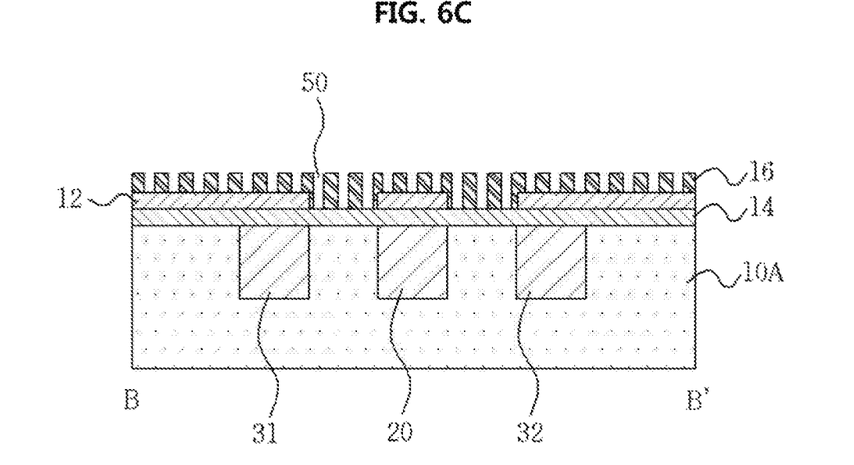
Figure 6D:
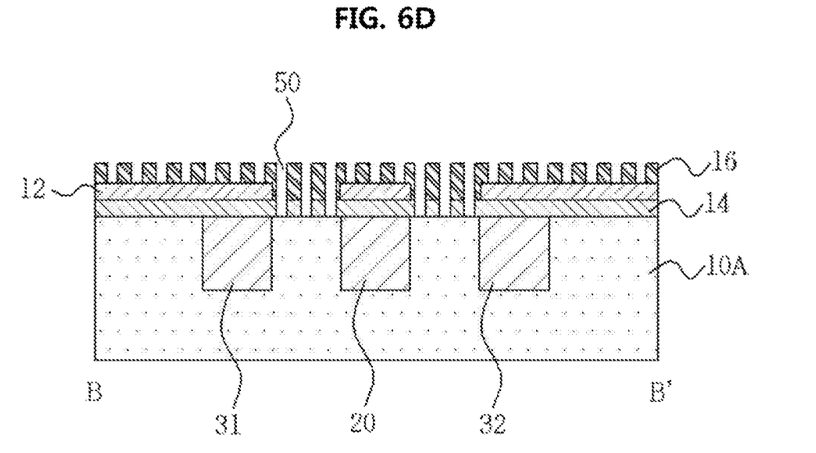

Referring to FIGS. 6C and 6D, a self-assembly polymer 16 may be deposited on the top surfaces of the photo resist 12 and the hard mask 14 corresponding to the target positions where the air holes 50 are to be formed, in order to form the air holes 50 having a periodic pattern in a vertical direction of the fuse link 20.

In order to form the air holes 50 having a periodic pattern in the self-assembly polymer 16 and the hard mask 14, the self-assembly polymer 16 and the hard mask 14 may be partially etched. The self-assembly polymer 16 may include a material obtained by synthesizing polystyrene and methylmethacrylate. For example, the polystyrene of the self-assembly polymer 16 may be rearranged to form a periodic pattern after annealing. The polystyrene of the self-assembly polymer 16 may be selectively removed by wet or dry etching, and form the air holes 50 with a periodic pattern.

Figure 6E:
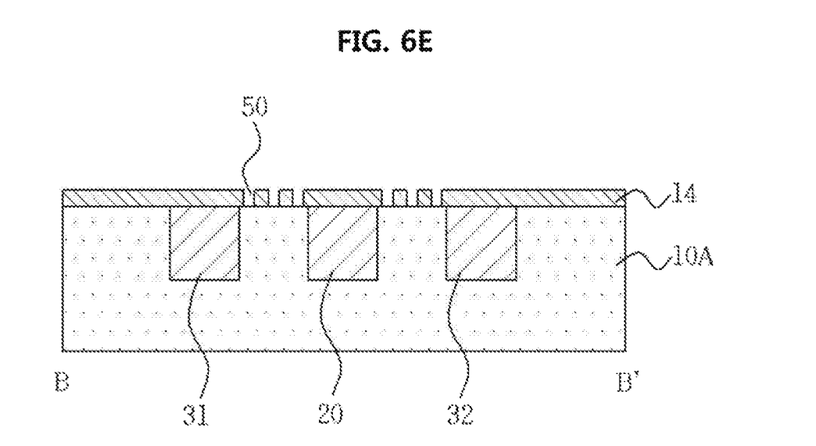

Referring to FIG. 6E, the photo resist 12 and the self-assembly polymer 16 are removed.

Figure 6F:
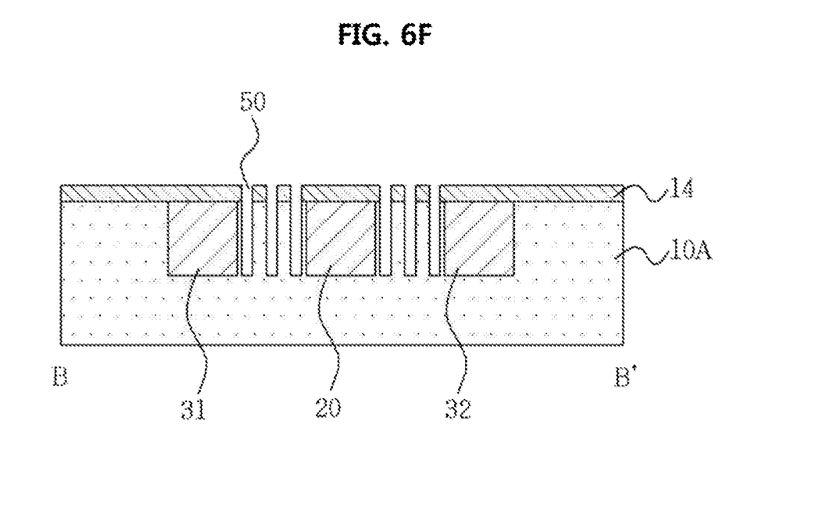

Referring to FIG. 6F, the first insulating layer 10A may be partially etched to transfer the air holes 50 having a periodic pattern into the first insulating layer 10A, the air holes 50 being formed in the hard mask 14. At this time, the first insulating layer 10A may be partially etched to form the air holes 50 at the same level or height as the fuse link 20 in the vertical direction of the fuse link 20. FIG. 6F illustrates that the air holes 50, the fuse link 20 and the dummy strip 30 are formed at the same level or height, but the present embodiment is not limited thereto. The air holes 50 may be expanded to a higher level, a lower level or higher and lower levels in the vertical direction of the fuse link 20.

Figure 6G:
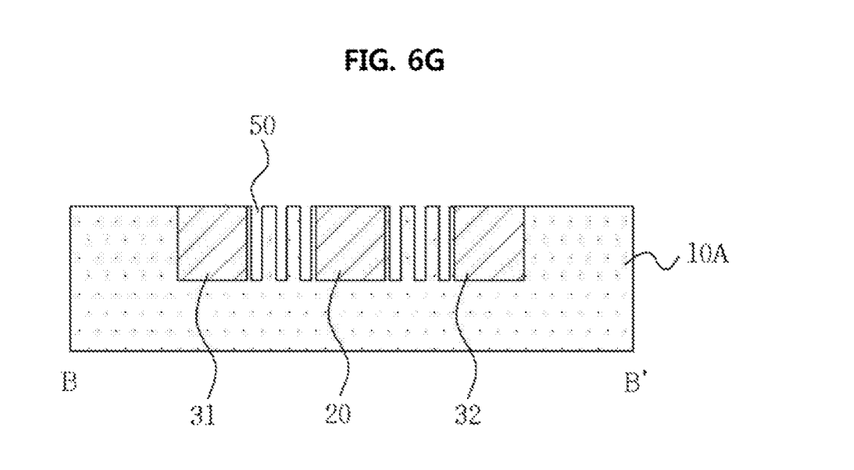

Referring to FIG. 6G, the hard mask 14 is removed after the first insulating layer 10A was etched.

Figure 6H:
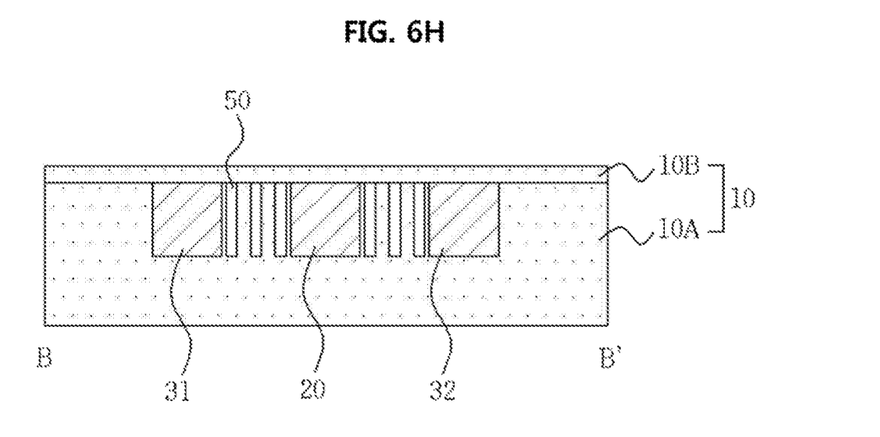

Referring to FIG. 6H, a second insulating layer 10B is deposited over the fuse link 20, the dummy strip 30 and the air holes 50 so as to cover the air holes 50 without filling the air holes 50. For example, as the second insulating layer 10B is deposited through CVD which allows a pinch-off, the air holes 50 may be sealed. The second insulating layer 10B may be formed of a material substantially the same as the first insulating layer 10A, and the first and second insulating layers 10A and 10B may correspond to the insulating layer 10 of FIGS. 3 and 4. The air holes 50 formed through the above-described process can insulate the fuse link 20 from the Joule's heat generated therein during fuse program, and prevent damage to the surrounding structures.

According to the present embodiments, fuse blowing can be performed at a lower program current, and the area of the program transistor can be significantly reduced, which makes it possible to reduce the area per fuse bit while improving the reliability.

Although various embodiments have been described for illustrative purposes, it will be apparent to those skilled in the art that various changes and modifications may be made without departing from the spirit and scope of the invention as defined in the following claims.

What is claimed is:

1. A fuse of a semiconductor device, comprising:
   a fuse link suitable for extending in a first direction and connecting first and second electrodes;
   a dummy strip suitable for extending in the first direction, and with a predetermined distance from the fuse link in a second direction perpendicular to the first direction; and
   an air channel formed between the fuse link and the dummy strip to directly contact with both sides of the fuse link and one side of the dummy strip to insulate thermally the fuse link and to prevent cracking of surrounding structures of the fuse link,
   wherein the air channel is directly contacted with both sides of the fuse link, and the dummy strip and the air channel are formed at a same level as the fuse link in a third direction that is vertical to the first and second directions, to improve the thermal drivability and the electronic drivability during a fuse program.

2. The fuse of claim 1, wherein the fuse link, the dummy strip and the air channel are formed in an insulating layer, and the air channel has a lower dielectric constant than the insulating layer.

3. The fuse of claim 1, wherein the dummy strip includes first and second dummy strips which are formed at both sides of the fuse link at the predetermined distance from the fuse link in the second direction, and extend in the first direction, and
   the air channel is formed between the fuse link and each of the first and second dummy strips to contact both sides of the fuse link and one side of each of the first and second dummy strips.

* * * * *